(12) United States Patent
Hatano

(10) Patent No.: US 8,421,071 B2
(45) Date of Patent: Apr. 16, 2013

(54) MEMORY DEVICE

(75) Inventor: Takehisa Hatano, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/345,834

(22) Filed: Jan. 9, 2012

(65) Prior Publication Data

US 2012/0181534 A1    Jul. 19, 2012

(30) Foreign Application Priority Data

Jan. 13, 2011   (JP) ................................. 2011-004874

(51) Int. Cl.
*H01L 29/88* (2006.01)

(52) U.S. Cl.
USPC ............... 257/43; 257/E29.068; 257/E29.309

(58) Field of Classification Search ..................... 257/43, 257/E29.296, E29.309, 314, 315
See application file for complete search history.

(56) References Cited

U.S. PATENT DOCUMENTS

| | | | |
|---|---|---|---|
| 4,466,081 A | 8/1984 | Masuoka | |
| 5,349,366 A | 9/1994 | Yamazaki et al. | |
| 5,473,563 A | 12/1995 | Suh et al. | |
| 5,541,879 A | 7/1996 | Suh et al. | |
| 5,546,341 A | 8/1996 | Suh et al. | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Zandra Smith
*Assistant Examiner* — Paul Patton
(74) *Attorney, Agent, or Firm* — Fish & Richardson P.C.

(57) ABSTRACT

A memory device in which a write error can be prevented is provided. The memory device includes a NAND cell unit including a plurality of memory cells connected in series, a first selection transistor connected to one of terminals of the NAND cell unit, a second selection transistor connected to the other of the terminals of the NAND cell unit, a source line connected to the first selection transistor, and a bit line which intersects with the source line and is connected to the second selection transistor. In the memory device, a channel region of each of the first selection transistor and the second selection transistor is formed in an oxide semiconductor layer.

22 Claims, 11 Drawing Sheets

U.S. PATENT DOCUMENTS

| | | | |
|---|---|---|---|
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,616,502 | B2 | 11/2009 | Iwai |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0002590 | A1 | 1/2009 | Kimura |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0097838 | A1 | 4/2010 | Tanaka et al. |
| 2010/0109002 | A1 | 5/2010 | Itagaki et al. |
| 2010/0148171 | A1 | 6/2010 | Hayashi et al. |
| 2010/0193785 | A1 | 8/2010 | Kimura |
| 2011/0101339 | A1* | 5/2011 | Yamazaki et al. .............. 257/43 |
| 2011/0101351 | A1 | 5/2011 | Yamazaki |
| 2011/0121286 | A1 | 5/2011 | Yamazaki et al. |
| 2011/0134683 | A1 | 6/2011 | Yamazaki et al. |
| 2011/0156023 | A1 | 6/2011 | Ieda |
| 2011/0156025 | A1 | 6/2011 | Shionoiri et al. |
| 2011/0205775 | A1 | 8/2011 | Matsuzaki et al. |
| 2011/0227062 | A1 | 9/2011 | Kato et al. |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-121721 | A | 4/1999 |
| JP | 11-505377 | A | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| WO | 2004/114391 | A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for Amoled Back-Plane," SID Digest '09 : SID International Symposium Digest of Technical Papers, May 31, 2009, pp. 280-283.

Clark, S et al.. "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room.Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas." The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and SC2O3-A2O3-BO Systems [A; Fe, Ga, Or Al; B: Mg, Mn, Fe, Ni, Cu,Or Zn] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn, J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. Amoled Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.

* cited by examiner

FIG. 5A
FIG. 5B
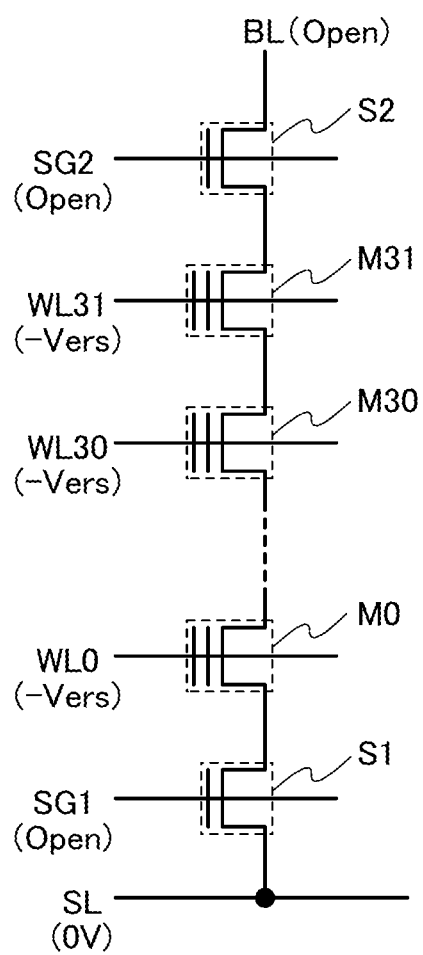
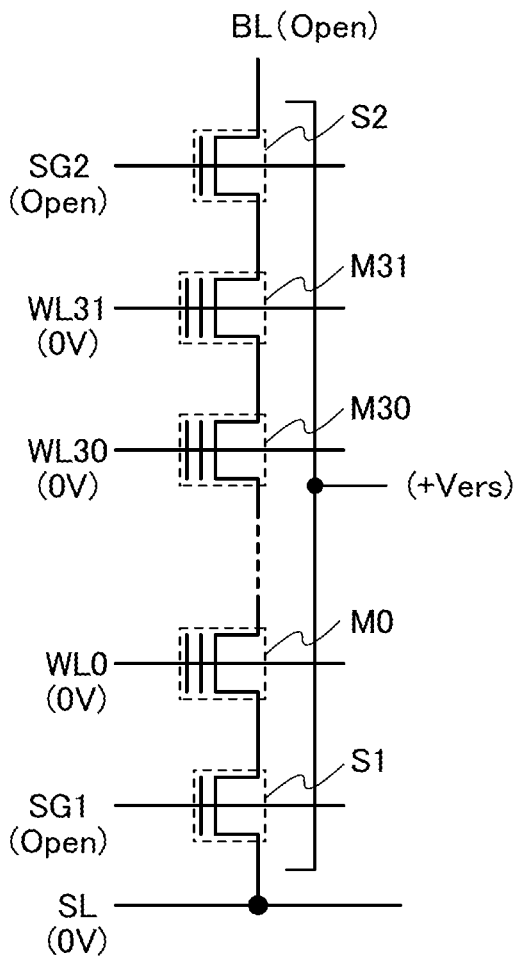

MEMORY DEVICE

BACKGROUND OF THE INVENTION

1. Field of the Invention

The present invention relates to a nonvolatile memory device which can write, read, and erase data electrically.

2. Description of the Related Art

As a memory device, a dynamic random access memory (DRAM) and a static random access memory (SRAM) which are categorized as a volatile memory; a mask read only memory (ROM), an electrically programmable read only memory (EPROM), an electrically erasable and programmable read only memory (EEPROM), a flash memory, and a ferroelectric random access memory which are categorized as a nonvolatile memory; and the like are given. Among the above memory devices, flash memories are widely marketed, which are mainly used for mobile storage media such as USB memories and memory cards. The reason of this is that flash memories are resistant to physical impact and can be conveniently used because they are non-volatile memories which can repeatedly write and delete data and can store data without being supplied with power.

The types of flash memory include NAND flash memories in which a plurality of memory cells is connected in series and NOR flash memories in which a plurality of memory cells is arranged in a matrix. Both of these flash memories have a transistor which functions as a memory element in each memory cell. Further, the transistor which functions as a memory element has a layer for accumulating electric charge, which is called floating gate, between a control gate and a channel region formed in a semiconductor substrate. The accumulation of electric charge in the floating gate enables storage of data (see Patent Document 1).

A NAND memory device includes a plurality of NAND cell units each including a plurality of adjacent memory cells. In each NAND cell unit, memory cells are connected in series and each memory cell has a common source or drain (an impurity region) with an adjacent memory cell. One of terminals of each NAND cell unit is connected to a common source line via a first selection transistor. The other of the terminals of each NAND cell unit is connected to a bit line via a second selection transistor. In the memory device, the selection gates of the first selection transistors connected to the respective NAND cell units are connected to one another; the selection gates of the second selection transistors connected to the respective NAND cell units are also connected to one another; the control gates of the memory cells in the same row are connected to one another.

In the NAND memory device, after a memory cell is put in an erased state, i.e., the memory cell is set to "1", "0" is written into the memory cell. In order to write "0" into the memory cell, one of the first selection transistor and the second selection transistor is turned off and the other is turned on. On the other hand, in order to hold "1" in the memory cell, the first selection transistor and the second selection transistor are both turned off.

REFERENCE

Patent Document

[Patent Document 1] Japanese Published Patent Application No. H11-121721

SUMMARY OF THE INVENTION

During when "1" is held, however, slight leakage current occurs in the first selection transistor and the second selection transistor, which causes a write error. Alternatively, in order to hold the off-state of the second selection transistor, a control circuit for controlling the second selection transistor needs to be provided additionally, which causes an increase in the size of a memory device.

In view of the above, an object of one embodiment of the present invention is to provide a memory device in which a write error can be prevented.

One embodiment of the present invention is a memory device which includes a NAND cell unit including a plurality of memory cells connected in series, a first selection transistor connected to one of terminals of the NAND cell unit, a second selection transistor connected to the other of the terminals of the NAND cell unit, a source line connected to the first selection transistor, and a bit line which intersects with the source line and is connected to the second selection transistor. In the memory device, a channel region of each of the first selection transistor and the second selection transistor is formed in an oxide semiconductor layer.

Another embodiment of the present invention is a memory device which includes a NAND cell unit including a plurality of memory cells connected in series, a first selection transistor provided between a first terminal of the NAND cell unit and a source line and connected to the first terminal of the NAND cell unit and the source line, and a second selection transistor provided between a second terminal of the NAND cell unit and a bit line and connected to the second terminal of the NAND cell unit and the bit line. In the memory device, a channel region of each of the first selection transistor and the second selection transistor is formed in an oxide semiconductor layer.

Another embodiment of the present invention is a memory device which includes a first selection transistor including a first terminal connected to a source line, and a second terminal connected to a first terminal of a NAND cell unit including memory cells connected in series; and a second selection transistor including a first terminal connected to a bit line, and a second terminal connected to a second terminal of the NAND cell unit including the memory cells connected in series. In the memory device, a channel region of each of the first selection transistor and the second selection transistor is formed in an oxide semiconductor layer.

Note that the first selection transistor and the second selection transistor overlap with the NAND cell unit with an insulating layer interposed therebetween.

The oxide semiconductor layer includes two or more elements selected from In, Ga, Sn, and Zn.

Use of a transistor in which an oxide semiconductor layer is used for a channel region as a selection transistor can prevent a write error in a memory device.

BRIEF DESCRIPTION OF THE DRAWINGS

In the accompanying drawings:

FIGS. 5A and 5B are circuit diagrams illustrating an operation of a memory device according to one embodiment of the present invention;

DETAILED DESCRIPTION OF THE INVENTION

Figure 1:
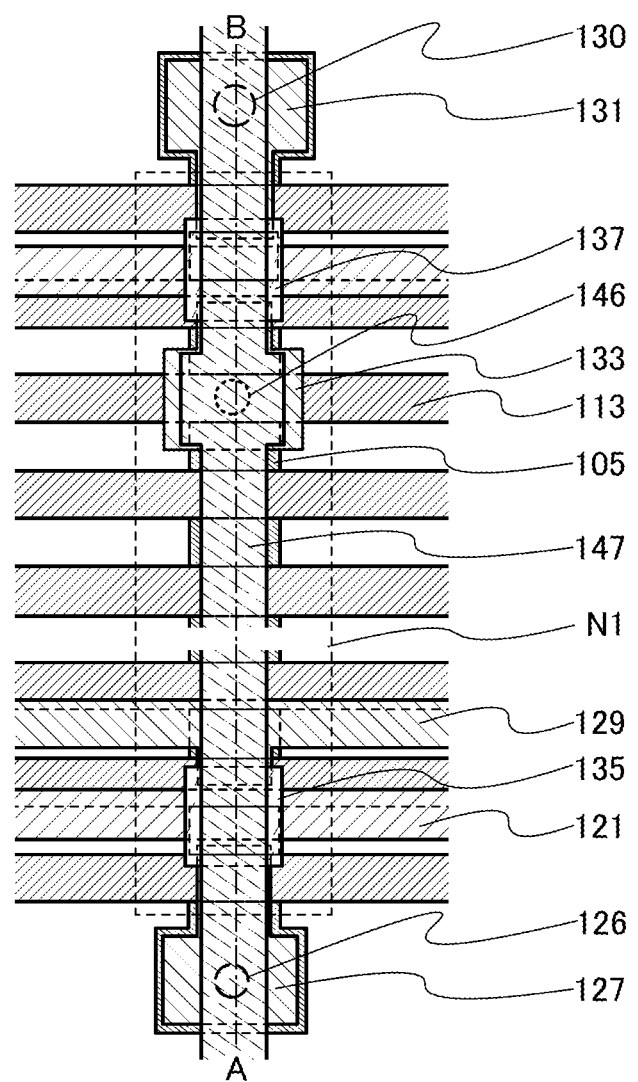
FIG. 1 is a top view illustrating a memory device according to one embodiment of the present invention.

Hereinafter, embodiments of the present invention are described with reference to the drawings. Note that the present invention is not limited to the following description. It is easily understood by those skilled in the art that the modes and details can be variously changed unless departing from the scope and spirit of the present invention. Therefore, the present invention should not be interpreted as being limited to the description of the embodiments given below. Note that reference numerals denoting the same portions are commonly used in different drawings.

The size, the thickness of a layer, and a region of each structure illustrated in the drawings and the like in the embodiments are exaggerated for simplicity in some cases. Therefore, embodiments of the present invention are not limited to such scales.

The terms with ordinal numbers such as "first", "second", and "third" in this specification are used in order to identify components, and the terms do not limit the components numerically.

Note that voltage refers to a potential difference between a predetermined potential and a reference potential (e.g., a ground potential) in many cases. Therefore, voltage, potential and a potential difference can be referred to as potential, voltage, and a voltage difference, respectively.

Note that both a source electrode and a drain electrode in a transistor are connected to a semiconductor layer. Current flows in accordance with a potential difference between the source electrode and the drain electrode when voltage is applied to a gate electrode; therefore, the source electrode and the drain electrode may be exchanged for each other depending on an operation, and it is difficult to identify the positions of the source electrode and the drain electrode. Therefore, in the case of describing a structure of a transistor, the terms a "pair of electrodes" are used. Alternatively, the terms "one of the pair of electrodes" and "the other of the pair of electrodes" are used. Further alternatively, the terms a "source electrode" and a "drain electrode" are used. There is no particular difference in meaning depending on such terms.

In addition, the expression two elements are "connected" means that two different elements are electrically connected to each other via a wiring, an element, an electrode, or the like as well as that two different elements are directly connected to each other.

Embodiment 1

In this embodiment, a NAND memory device in which a transistor including an oxide semiconductor layer is used as a selection transistor for controlling the potential of a channel region of a Memory cell will be described with reference to FIG. 1, FIG. 2, and FIG. 3.

Figure 3:
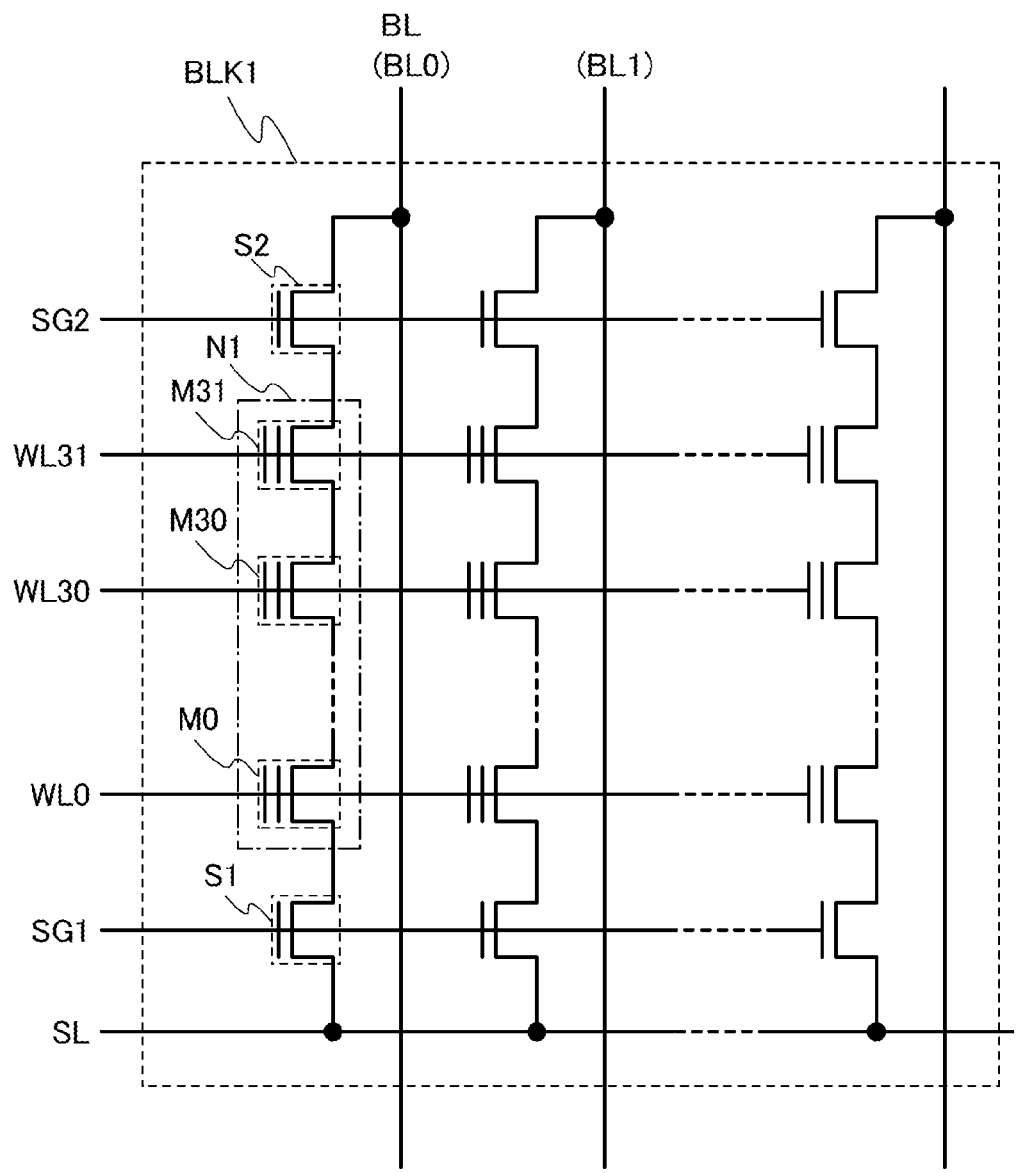
FIG. 3 is a circuit diagram illustrating a memory device according to one embodiment of the present invention.

FIG. 3 is a circuit diagram illustrating a NAND memory cell array included in a memory device. A NAND cell unit N1 is connected to a source line SL via a first selection transistor S1, and connected to a bit line BL via a second selection transistor S2. In the NAND cell unit N1, a plurality of memory cells (M0 to M31) is connected in series. In other words, one of a source and a drain of the first selection transistor S1 is connected to the source line SL. One of terminals of the NAND cell unit N1 is connected to the other of the source and the drain of the first selection transistor S1. The other of the terminals of the NAND cell unit N1 is connected to one of a source and a drain of the second selection transistor S2. The other of the source and the drain of the second selection transistor S2 is connected to the bit line BL. A block BLK1 is formed by a plurality of NAND cell units, a plurality of first selection transistors S1, and a plurality of second selection transistors S2.

In one row in the block BLK1, the first selection transistor S1 and the other first selection transistors are connected to a selection gate line SG1. In one row in the block BLK1, the second selection transistor S2 and the other second selection transistors are connected to a selection gate line SG2. In one row in the block BLK1, a memory cell in the NAND cell unit N1 and the other memory cells are connected to a common word line. In FIG. 3, there are 32 word lines in the block. BLK1 (word lines WL0 to WL31).

Next, a top view structure and a cross-sectional structure of the first selection transistor S1, the NAND cell unit N1, and the second selection transistor S2 will be described with reference to FIG. 1 and FIG. 2.

Figure 2:
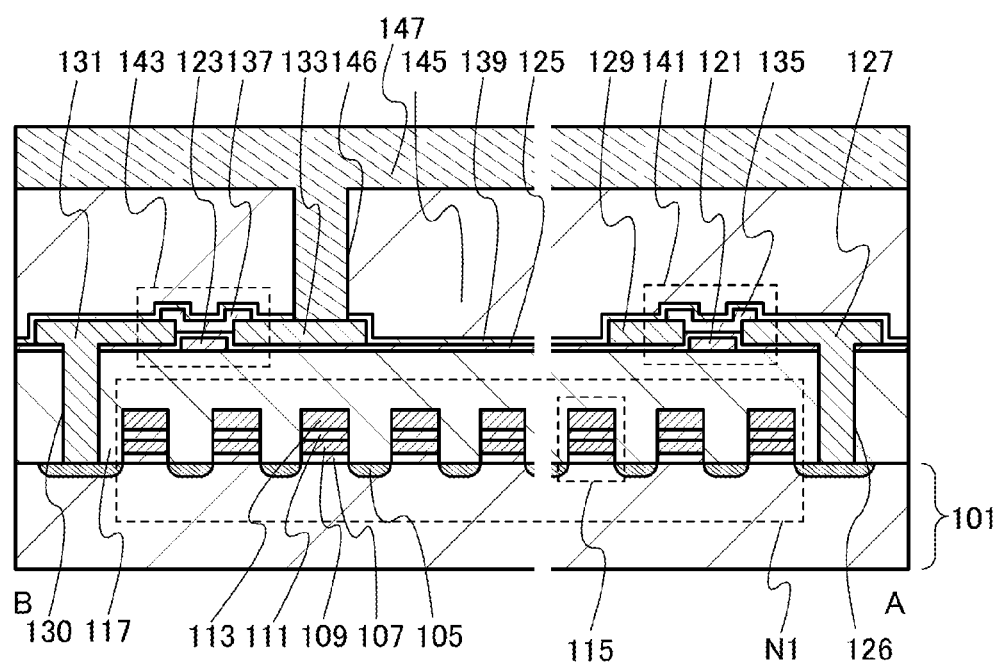
FIG. 2 is a cross-sectional view illustrating a memory device according to one embodiment of the present invention.

FIG. 1 is a top view of the NAND cell unit N1. FIG. 2 is a cross-sectional view taken along dashed-and-dotted line A-B in FIG. 1. Note that the first selection transistor S1 and the second selection transistor S2 in FIG. 3 corresponds to a selection transistor 141 and a selection transistor 143 in FIG. 2, respectively.

In the NAND cell unit N1, memory cells 115 adjoin with one another and each memory cell 115 has a common source or drain (an impurity region 105) with an adjacent memory cell 115; thus, the memory cells 115 are connected in series. An insulating layer 117 is provided over the memory cells 115. The selection transistors 141 and 143 are provided over the insulating layer 117.

An electrode 129 which is one of a pair of electrodes of the selection transistor 141 serves as the source line SL. An electrode 127 which is the other of the pair of electrodes of the selection transistor 141 is connected to the impurity region 105 which is one of terminals of a memory cell 115 through an opening 126 formed in the insulating layer 117.

An electrode 131 which is one of a pair of electrodes of the selection transistor 143 is connected to the impurity region 105 which is the other of terminals of the memory cell 115 through an opening 130 formed in the insulating layer 117. An electrode 133 which is the other of the pair of electrodes of the selection transistor 143 is connected to a conductive layer 147 through an opening 146 formed in insulating layers 139 and 145 over the selection transistors 141 and 143. Note that the conductive layer 147 serves as the bit line BL. A feature of this embodiment is that the selection transistors 141 and 143 are transistors in which an oxide semiconductor layer is used for a channel region.

Since an oxide semiconductor has a wide energy gap, a transistor in which an oxide semiconductor layer is used for a channel region has an extremely low off-state current. Hence, use of such transistors including an oxide semiconductor layer as the selection transistors 141 and 143 leads to a reduction in leakage current. Therefore, a write error in a memory device can be prevented. Further, the selection transistors overlap with the NAND cell unit with the insulating layer interposed therebetween, which enables high integration of the memory device.

Next, one mode of the structure of the memory cell 115 will be described below.

The memory cell 115 includes a semiconductor substrate 101 including the impurity region 105, and a first insulating layer 107, a floating gate electrode 109, a second insulating layer 111, and a control gate electrode 113 which are stacked over the semiconductor substrate 101. A channel region formed in the semiconductor substrate 101 is positioned between the impurity regions 105 formed in the semiconductor substrate 101 and in a region overlapping with the floating gate electrode 109 and the control gate electrode 113.

Typical examples of substrates used as the semiconductor substrate include a single crystal silicon substrate (a silicon wafer) having n-type or p-type conductivity, and a compound semiconductor substrate (e.g., a SiC substrate, a sapphire substrate, or a GaN substrate). A silicon-on-insulator (SOI) substrate can also be used as the semiconductor substrate. Examples of the SOI substrate that can be used as the semiconductor substrate include a so-called SIMOX (separation by implanted oxygen) substrate which is formed in such a manner that after an oxygen ion is implanted into a mirror-polished wafer, an oxide layer is formed at a certain depth from the surface and defects generated in a surface layer are eliminated by high-temperature heating; an SOI substrate formed by the Smart-Cut process in which a semiconductor substrate is cleaved by utilizing growth of a minute void, which is formed by implantation of a hydrogen ion, by heat treatment; and an SOI substrate formed by ELTRAN (epitaxial layer transfer: a registered trademark of Canon Inc.); or the like.

A pair of impurity regions 105 serves as a source and a drain of the memory cell 115. In the case where the semiconductor substrate 101 has p-type conductivity, the impurity region 105 is formed by addition of an n-type impurity such as phosphorus or arsenic. On the other hand, in the case where the semiconductor substrate 101 has n-type conductivity, the impurity region 105 is formed by addition of a p-type impurity such as boron. Note that the concentration of the impurity (n-type impurity or p-type impurity) in the impurity region 105 is higher than or equal to $1\times10^{19}/cm^3$ and lower than or equal to $1\times10^{21}/cm^3$. In this embodiment, a p-type semiconductor substrate is used as the semiconductor substrate 101, and n-type impurity regions are formed as the pair of impurity regions 105.

The first insulating layer 107 can serve as a tunnel insulating layer in a nonvolatile memory element. The second insulating layer 111 can serve as a control insulating layer in a nonvolatile memory element. The first insulating layer 107 is preferably formed using silicon oxide or a stacked structure of silicon oxide and silicon nitride. The thickness of the first insulating layer 107 is preferably greater than or equal to 1 nm and less than or equal to 10 nm; further preferably, greater than or equal to 1 nm and less than or equal to 5 nm.

The second insulating layer 111 is formed of one or more layers of silicon oxide, silicon nitride, silicon oxynitride, aluminum oxide, and the like. The thickness of the second insulating layer 111 is greater than or equal to 1 nm and less than or equal to 20 nm; preferably greater than or equal to 5 nm and less than or equal to 10 nm.

The floating gate electrode 109 can be formed using a conductive layer, a polycrystalline silicon layer, a silicon quantum structure, or the like. As the conductive layer, for example, a layer including an element selected from tungsten, tantalum, titanium, molybdenum, chromium, and nickel; a layer including nitride of such an element (typically, a tungsten nitride layer, a tantalum nitride layer, or a titanium nitride layer); an alloy layer in which such elements are combined (typically, a Mo—W alloy layer or a Mo—Ta alloy layer); or a silicide layer of such an element (typically, a tungsten silicide layer, a titanium silicide layer, or a nickel silicide layer) can be used. The polycrystalline silicon layer may be doped with an impurity such as phosphorus or boron. The silicon quantum structure refers to crystalline silicon in which a crystal grain size is several nanometers in diameter. The silicon quantum structure is also called silicon dot.

Instead of the floating gate electrode 109, a charge accumulation layer formed using silicon nitride, germanium nitride, or the like may be used.

The control gate electrode 113 is preferably formed using a metal selected from metals such as tantalum, tungsten, titanium, molybdenum, chromium, and niobium, or an alloy material or a compound material including any of the metals as its main component. Further, polycrystalline silicon to which an impurity element such as phosphorus is added can be used. Furthermore, the control gate electrode 113 may be formed to have a stacked structure of a layer of a metal nitride and a layer of any of the above metals. Examples of the metal nitride include tungsten nitride, molybdenum nitride, and titanium nitride. The metal nitride layer leads to improvement in adhesion of the layer of a metal; therefore, separation of layers can be prevented.

Although not shown, adjacent NAND cell units are separated by an element separation layer.

A spacer formed or an insulating layer may be formed on a sidewall of the first insulating layer 107, the floating gate electrode 109, the second insulating layer 111, and the control gate electrode 113. The spacer is effective in preventing leakage current at an edge of the floating gate electrode 109 and an edge of the control gate electrode 113. In addition, by utilizing the spacer, low-concentration impurity regions can be formed under the spacer. Each of such low-concentration impurity regions serves as a lightly doped drain (LDD). Although the low-concentration impurity regions are not necessarily formed, the low-concentration impurity regions relieves the electric field at an edge of a drain; thus, deterioration of a memory cell can be suppressed.

Although not shown, in the case where the semiconductor substrate 101 has n-type conductivity, a p-well region into which a p-type impurity is implanted may be formed and a p-channel transistor may be formed in a portion including the region; and in the case where the semiconductor substrate 101 has p-type conductivity, a n-well region into which a n-type impurity is implanted may be formed and a n-channel transistor may be formed in a portion including the region. The concentration of n-type impurity or p-type impurity in the p-well region or the n-well region is higher than or equal to $5\times10^{15}/cm^3$ and lower than or equal to $1\times10^{16}/cm^3$.

The insulating layer 117 is provided over the memory cell 115. The insulating layer 117 functions as an interlayer insulating layer that insulates the memory cells 115 from the selection transistors 141 and 143. Examples of the insulating layer 117 include a silicon oxide layer, a silicon nitride layer, a silicon oxynitride layer, and a silicon nitride oxide layer. Alternatively, a layer formed including an organic material such as an epoxy resin, polyimide, polyamide, polyvinyl phenol, benzocyclobutene, or acrylic; or a layer formed including a siloxane material such as a siloxane resin can be used. Further, the insulating layer 117 is preferably formed including a low-dielectric constant material having a dielectric constant of about 4 or lower, such as SiOF, SiOC, DLC, porous silica, or the like. Such a low-dielectric constant material having a dielectric constant of 4 or lower is also called low-k material. With use of such an insulating layer formed using a low-k material, capacitance between wirings can be lowered and thus power consumption can be reduced.

The selection transistor 141 includes a gate electrode 121 provided over the insulating layer 117, a gate insulating layer 125 covering the insulating layer 117 and the gate electrode 121, the pair of electrodes 127 and 129 provided over the gate insulating layer 125, and an oxide semiconductor layer 135 in contact with the gate insulating layer 125 and the pair of electrodes 127 and 129. The electrode 129 which is one of the pair of electrodes of the selection transistor 141 serves as the source line SL. The electrode 127 which is the other of the pair of electrodes is connected to the impurity region 105 of the memory cell 115 through the opening 126 formed in the insulating layer 117 and the gate insulating layer 125.

The selection transistor 143 includes a gate electrode 123 provided over the insulating layer 117, the gate insulating layer 125 covering the insulating layer 117 and the gate electrode 123, the pair of electrodes 131 and 133 provided over the gate insulating layer 125, and an oxide semiconductor layer 137 in contact with the gate insulating layer 125 and the pair of electrodes 131 and 133. The electrode 131 which is one of the pair of electrodes is connected to the impurity region 105 of the memory cell 115 through the opening 130 formed in the insulating layer 117 and the gate insulating layer 125. The electrode 133 which is the other of the pair of electrodes of the selection transistor 143 is connected to the conductive layer 147 serving us the bit line BL through an opening 146 formed in the insulating layers 139 and 145 which are formed over the selection transistors 141 and 143.

For the gate electrodes 121 and 123, a metal element selected from aluminum, chromium, copper, tantalum, titanium, molybdenum, and tungsten; an alloy containing any of these metal elements as a component; an alloy containing these metal elements in combination; or the like. Further, one or both metal elements selected from manganese and zirconium may be used. The gate electrodes 121 and 123 each may have a single layer structure or a stacked structure of two or more layers. For example, a single layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like are given. Alternatively, a layer, an alloy layer, or a nitride layer which contains aluminum and one or more elements selected from titanium, tantalum, tungsten, molybdenum, chromium, neodymium, and scandium may be used.

For the gate electrodes 121 and 123, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be also used. A stacked structure formed using any of the above light-transmitting conductive materials and any of the above metal elements is also possible.

Further, as a layer in contact with the gate insulating layer 125, an In—Ga—Zn-based oxide layer containing nitrogen, an In—Sn-based oxide layer containing nitrogen, an In—Ga-based oxide layer containing nitrogen, an In—Zn-based oxide layer containing nitrogen, a Sn-based oxide layer containing nitrogen, an In-based oxide layer containing nitrogen, a metal nitride layer (InN, ZnN, or the like), or the like is preferably provided between the gate electrodes 121 and 123 and the gate insulating layer 125. These layers each have a work function of 5 eV, preferably 5.5 eV or higher and can make the threshold voltage which is one of electric characteristics of a transistor positive; accordingly, a so-called normally-off switching element can be achieved. For example, in the case of using an In—Ga—Zn-based oxide containing nitrogen, an In—Ga—Zn-based oxide having a higher nitrogen concentration than at least the oxide semiconductor layer, specifically, an In—Ga—Zn-based oxide having a nitrogen concentration of 7 atomic % or higher is used.

The gate insulating layer 125 is formed using an oxide insulating layer from which part of oxygen is released by heating. The oxide insulating layer from which part of oxygen is released by heating is preferably an oxide insulating layer which contains oxygen whose amount exceeds the amount of oxygen satisfying the stoichiometric proportion. The oxide insulating layer from which part of oxygen is released by heating allows oxygen to be diffused into the oxide semiconductor layer 137 by heating. Typical examples of the oxide insulating layer that can be applied to the gate insulating layer 125 include a silicon oxide layer, a silicon oxynitride layer, a silicon nitride oxide layer, an aluminum oxide layer, an aluminum oxynitride layer, a gallium oxide layer, a hafnium oxide layer, and an yttrium oxide layer.

For the pair of electrodes 127 and 129 and the pair of electrodes 131 and 133, a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese, magnesium, zirconium, and beryllium may be used. The pair of electrodes 127 and 129 and the pair of electrodes 131 and 133 each may have a single layer structure or a stacked structure of two or more layers. For example, a single layer structure of an aluminum layer containing silicon, a two-layer structure in which an aluminum layer is stacked over a titanium layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure in which a titanium layer, an aluminum layer, and a titanium layer are stacked in this order, are given. Alternatively, a layer, an alloy layer, or a nitride layer which contains aluminum and one or more elements selected from titanium, tantalum, tungsten, molybdenum, chromium, neodymium, and scandium may be used. Provision of a barrier layer such as a titanium layer, a titanium nitride layer, or a tantalum nitride layer in a region in contact with the semiconductor substrate 101 can prevent generation of hillock in aluminum or aluminum silicon. In the case where a layer of titanium, which is an element having a high reducing property, is formed as the barrier layer, even when an insulating layer, which is formed in such a manner that a semiconductor substrate is exposed to the atmosphere and oxidized, is formed over the semiconductor substrate, the insulating layer can be reduced; thus, a favorable contact between the electrode and the semiconductor substrate can be obtained.

Examples of oxides for the oxide semiconductor layers 135 and 137 include a four-component metal oxide such as an In—Sn—Ga—Zn-based oxide; a three-component metal oxide such as an In—Ga—Zn-based oxide, an In—Sn—Zn-based oxide, an In—Al—Zn-based oxide, a Sn—Ga—Zn-based oxide, an Al—Ga—Zn-based oxide, or a Sn—Al—Zn-based oxide; a two-component metal oxide such as an In—Zn-based oxide, a Sn—Zn-based oxide, an Al—Zn-based oxide, or an In—Ga-based oxide. Further, $SiO_2$ may be contained in the above oxide semiconductor. Here, for example, In—Ga—Zn-based oxide means an oxide containing indium (In), gallium (Ga), and zinc (Zn). Note that the above metal oxide containing nitrogen at a concentration higher than or equal to $1\times10^{17}/cm^3$ and lower than $5\times10^{19}/cm^3$ may be used for the oxide semiconductor layers 135 and 137.

Note that the energy gap of the metal oxide which can be used for the oxide semiconductor layers 135 and 137 is 2 eV or higher, preferably 2.5 eV or higher, further preferably 3 eV or higher. With use of such an oxide semiconductor having a wide energy gap off-state current of a transistor can be reduced.

The carrier density of each of the oxide semiconductor layers 135 and 137 is lower than $5\times10^{14}/cm^3$, preferably lower than $1\times10^{12}/cm^3$, further preferably lower than or equal to $1\times10^{11}/cm^3$. In the oxide semiconductor layers 135 and 137, it is preferable that hydrogen or oxygen deficiency serving as a donor be little and the hydrogen concentration be lower than or equal to $1\times10^{16}/cm^3$.

Such a reduction in hydrogen concentration in the oxide semiconductor layers 135 and 137 can improve electric characteristics and reliability of a transistor.

For the oxide semiconductor layers 135 and 137, a material with an amorphous state can be used. Alternatively, a material with a mixed state of an amorphous state and a crystalline state can be used.

Alternatively, the oxide semiconductor layers 135 and 137 may be formed using a non-single-crystal material including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis, that is, a c-axis-aligned crystalline oxide semiconductor (CAAC oxide semiconductor).

The CAAC oxide semiconductor is not single crystal and, in addition, is not composed of only an amorphous component. Although the CAAC oxide semiconductor includes a crystallized portion (crystalline portion), a boundary between one crystalline portion and another crystalline portion is not clear in some cases.

Nitrogen may be substituted for part of or all of oxygen included in the CAAC oxide semiconductor. The c-axes of individual crystalline portions included in the CAAC oxide semiconductor may be aligned in a certain direction (e.g., a direction perpendicular to a surface of a substrate over which the CAAC oxide semiconductor layer is formed or a surface, layer surface, or interface of the CAAC oxide semiconductor layer). Alternatively, the normals of the a-b planes of the individual Crystalline portions included in the CAAC oxide semiconductor may be aligned in a certain direction (e.g., a direction perpendicular to the surface of a substrate, the surface, layer surface, interface of the CAAC oxide semiconductor, or the like).

The CAAC oxide semiconductor becomes a conductor, a semiconductor, or an insulator depending on its composition or the like. The CAAC oxide semiconductor transmits or does not transmit visible light depending on its composition or the like.

An example of a CAAC oxide semiconductor is a material which is formed into a layer shape and has a triangular or hexagonal atomic arrangement when observed from the direction perpendicular to a surface of the layer, a surface of a substrate, or an interface and in which metal atoms are arranged in a layered manner or metal atoms and oxygen atoms (or nitrogen atoms) are arranged in a layered manner when a cross section of the layer is observed.

A transistor including a CAAC oxide semiconductor causes only a small change in threshold voltage before and after light irradiation or the BT stress test, and thus has stable electrical characteristics.

With use of an oxide semiconductor layer for a channel region of each of the selection transistors 141 and 143, off-state current can be reduced to lower than or equal to $1\times10^{-19}$ A/μm, and further, lower than or equal to $1\times10^{-20}$ A/μm. Hence, use of such transistors in which an oxide semiconductor layer is used for a channel region as the selection transistors 141 and 143 leads to a reduction in leakage current. Therefore, a write error in a memory device can be prevented.

The selection transistors 141 and 143 described in this embodiment can have a bottom gate structure including the gate electrode formed over the insulating layer 117, the gate insulating layer formed over the gate electrode, the oxide semiconductor layer overlapping with the gate electrode with the gate insulating layer interposed therebetween, and the pair of electrodes formed over the oxide semiconductor layer and the gate insulating layer.

Alternatively, the selection transistors 141 and 143 described in this embodiment can have a top gate structure including the oxide semiconductor layer formed over the insulating layer 117, the pair of electrodes formed over the oxide semiconductor layer, the gate insulating layer formed over the oxide semiconductor layer and the pair of electrodes, and the gate electrode overlapping with the oxide semiconductor layer with the gate insulating layer interposed therebetween.

Further alternatively, for the selection transistors 141 and 143 described in this embodiment, a top gate structure including the pair of electrodes formed over the insulating layer 117, the oxide semiconductor layer formed over the pair of electrodes, the gate insulating layer formed over the oxide semiconductor layer and the pair of electrodes, and the gate electrode overlapping with the oxide semiconductor layer with the gate insulating layer interposed therebetween can be used.

For the insulating layer 139, a material and a structure similar to those of the gate insulating layer 125 can be employed as appropriate.

For the insulating layer 145, a material and a structure similar to those of the insulating layer 117 can be employed as appropriate.

Next, writing, erasing, and reading data in the NAND memory device according to this embodiment will be described in connection with FIGS. 4A and 4B, FIGS. 5A and 5B, and FIG. 6.

First, data writing will be described.

A writing operation is carried out after the NAND cell unit N1 is in an erased state, i.e., the threshold voltage of each memory cell in the NAND cell unit N1 is set negative. Note that data in a memory cell is "1" when the threshold voltage is negative, and data in the memory cell is "0" when the threshold voltage is positive. Hence, it can be said that when the NAND cell unit N1 is in an erased state, "1" is written into all memory cells. Writing is sequentially performed from the memory cell M0 on the source line SL side. Description of writing into the memory cell M0 will be given below as an example.

Figure 4A:
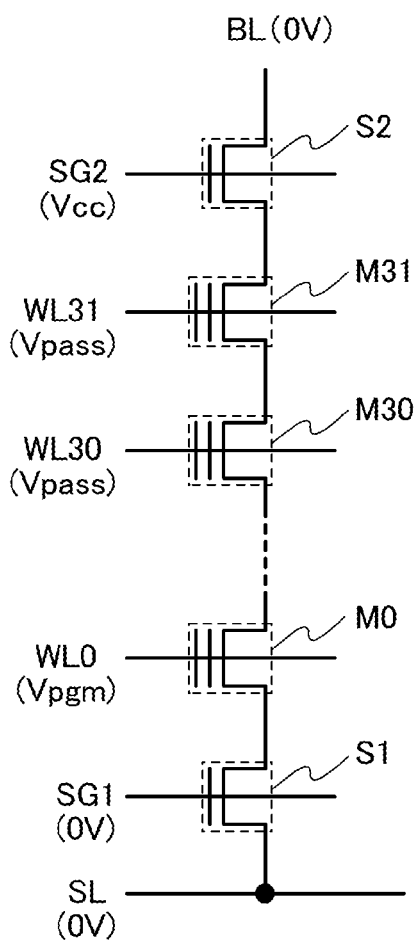
FIGS. 4A and 4B are circuit diagrams illustrating an operation of a memory device according to one embodiment of the present invention.

As illustrated in FIG. 4A, in the case where "0" is written, Vcc (a power supply voltage) is applied to the selection gate line SG2 to turn the second selection transistor S2 on and the bit line BL is set to 0 V (a ground voltage), for example. The selection gate line SG1 is set to 0 V to turn the first selection transistor S1 off. Next, the voltage of the word line WL0 of the memory cell M0 is set to be a high voltage Vpgm (approximately 20 V), and the voltages of the other word lines are each set to be an intermediate voltage Vpass (approximately 10 V) which is slightly higher than the power supply voltage Vcc. Since the voltage of the bit line BL is 0 V, the potential of a channel region of the selected memory cell M0 is 0 V. A potential difference between the word line WL0 and the channel region is large, and electrons are injected to the floating gate electrode of the memory cell M0 due to Fowler-Nordheim (F-N) tunnel current (hereinafter referred to as F-N tunnel current). Accordingly, the threshold voltage of the memory cell M0 is changed to be positive (a state in which "0" is written into the memory cell M0).

Figure 4B:
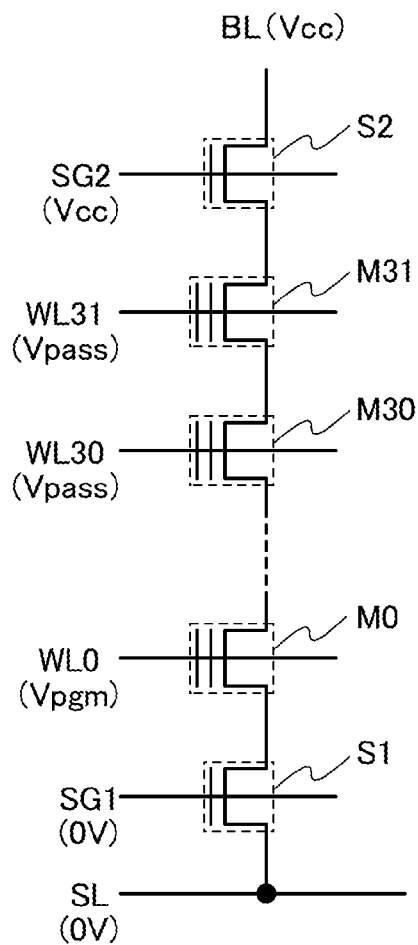

On the other hand, as in FIG. 4B, in a memory cell in which "1" is held, for example, when the bit line BL is set to Vcc (power supply voltage), a potential of a source of the second selection transistor S2 rises and reaches Vcc-Vth (Vth is a threshold voltage of the second selection transistor S2) and thus the second selection transistor S2 is turned off. At that time, the potentials of channel regions in memory cells of the NAND cell unit are also charged to be Vcc-Vth. Therefore, a channel region of the memory cell M0 is in a floating state. Next, when a high voltage Vpgm (20 V) is applied to the word line WL0 and an intermediate voltage Vpass (10 V) is applied to the other word lines, the voltages of the channel regions rise from Vcc-Vth to become, and for example, the voltage of the channel region of the memory cell M0 becomes approximately 8 V due to capacitive coupling between the word lines and the channel regions. Because the voltage of the channel region of the memory cell M0 is boosted to a high voltage, a potential difference between the word line WL0 and the channel region is small, in contrast to the case where "0" is written. Accordingly, electron injection by F-N tunnel current does not occur in the floating gate electrode of the memory cell M0, and electrons remain in the channel region. Thus, the threshold voltage of the memory cell M0 is maintained to be negative (a state in which "1" is held in the memory cell M0).

Next, data erasing will be described.

When an erasing operation is performed, as shown in FIG. 5A, a high negative voltage (-Vers) is applied to all of the word lines in a selected block, open voltage (Open) is applied to the bit line BL, the selection gate line SG1, and the selection gate line SG2, and 0 V is applied to the source line SL, so that the bit line BL and the source line SL are put in a floating state. Thus, electrons in floating gate electrodes of all of the memory cells in the block are discharged into the semiconductor layer by tunnel current. As a result, threshold voltages of these memory cells shift to the negative direction.

Alternatively, as shown in FIG. 5B, all of the word lines in a selected block is set to 0 V and a high positive voltage (+Vers) is applied to the semiconductor substrate 101, open voltage (Open) is applied to the bit line BL, the selection gate line SG1 and the selection gate line SG2, and 0 V is applied to the source line SL, so that the bit line BL and the source line SL are put in a floating state. Thus, electrons in floating gate electrodes of all of the memory cells in the block are discharged into the semiconductor substrate by tunnel current. As a result, threshold voltages of these memory cells shift to the negative direction.

Next data reading will be described.

Figure 6:
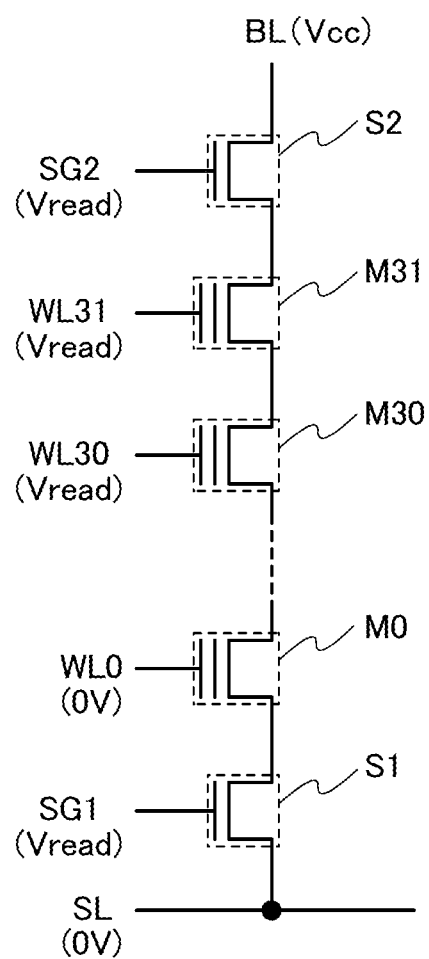
FIG. 6 is a circuit diagram illustrating an operation of a memory device according to one embodiment of the present invention.

In a reading operation shown in FIG. 6, a voltage of the word line WL0 of the memory cell M0 selected for reading is set to the voltage Vr (e.g., 0 V), and the word lines WL1 to WL31 of unselected memory cells and the selection gate lines SG1 and SG2 are set to an intermediate voltage Vread for reading. The intermediate voltage Vread for reading is slightly higher than the power supply voltage Vcc. 0 V is applied to the source line SL, and the power supply voltage Vcc is applied to the bit line BL. In this manner, it is detected whether or not current is flowing through the memory cell M0 selected for reading. That is, when the data stored in the memory cell M0 is "0", the memory cell M0 is off; thus, the bit line BL does not discharge electricity. On the other hand, in the case where the data stored in the memory cell M0 is "1", the memory cell M0 is turned on; thus, the bit line BL discharges electricity.

In each of the first selection transistor S1 and the second selection transistor S2 of the memory device described in this embodiment, an oxide semiconductor layer is used for a channel region. Since a transistor in which an oxide semiconductor layer is used for a channel region has an extremely low off-state current, when the data stored in the memory cells are "1", leakage current is not generated in the first selection transistor S1 and the second selection transistor S2, so that the NAND cell unit N1 can be surely in a floating state. As a result, in a memory cell in which data "1" is stored, voltage of the channel region is increased from Vcc-Vth due to capacitance coupling between the word line and the channel region and thus a potential difference between the word line WL and the channel region can be small. In this manner, "1" can be surely held and write errors can be suppressed without providing an additional control circuit. In addition, a reduction in the size of a memory device is possible.

Next, a structure of the memory device will be described referring to FIG. 7.

Figure 7:
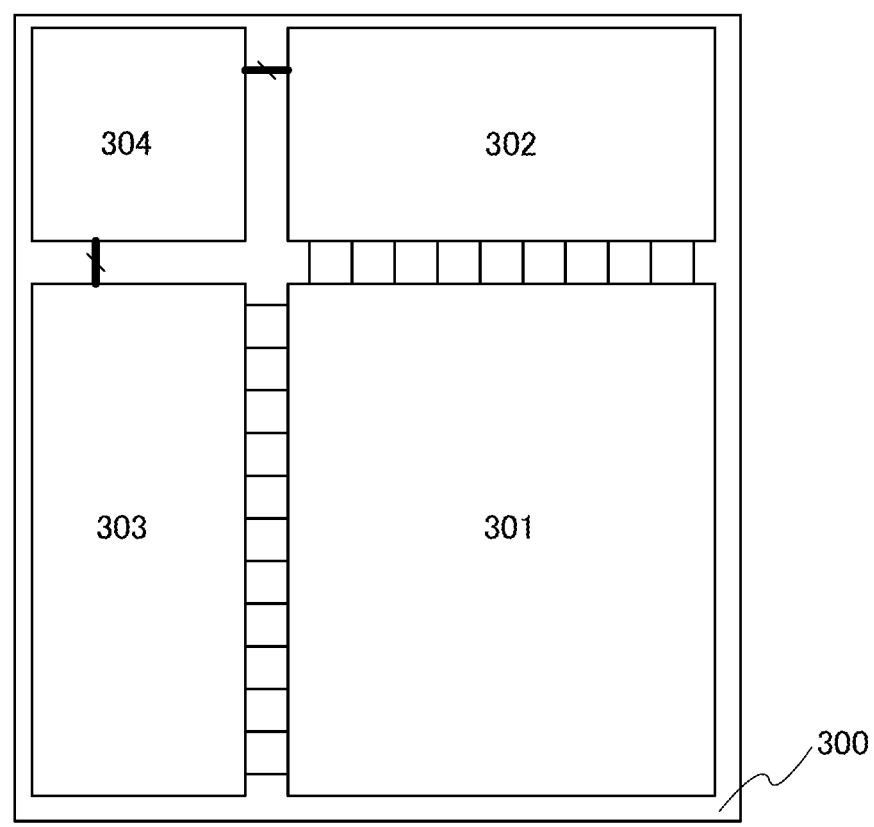
FIG. 7 is a block diagram illustrating a memory device according to one embodiment of the present invention.

FIG. 7 is a block diagram illustrating a memory device provided with a memory cell array. The memory cell array includes a plurality of blocks BLK1, one of which is illustrated in FIG. 3. A memory device 300 includes a memory cell array 301, a column decoder 302, a row decoder 303, and an interface circuit 304. The memory cell array 301 includes a plurality of memory cells arranged in a matrix.

The interface circuit 304 generates a signal for driving the column decoder 302 and the row decoder 303 on the basis of a signal received from the outside and outputs data which is read from the memory cell to the outside.

The column decoder 302 receives a signal for driving the memory cell from the interface circuit 304 and generates a signal for writing or reading which is to be transmitted to a bit line. The row decoder 303 receives a signal for driving the memory cell from the interface circuit 304 and generates a signal for data writing or reading which is to be transmitted to a word line. With the signal which is to be output to the bit line from the column decoder 302 and the signal which is to be output to the word line from the row decoder 303, the memory cell which performs access in the memory cell array 301 is uniquely determined.

In the memory device according to this embodiment, a transistor including an oxide semiconductor layer is used as a selection transistor. Since the transistor has an extremely low off-state current, leakage current can be reduced. Therefore, a write error in a memory device can be prevented. Further, the selection transistors overlap with the NAND cell unit with the insulating layer interposed therebetween, which enables high integration of the memory device.

Embodiment 2

In this embodiment, a method for manufacturing the memory device described in Embodiment 1 will be described with reference to FIGS. 8A to 8C, FIGS. 9A to 9C, and FIG. 10.

A first insulating layer, a first conductive layer, a second insulating layer, and a second conductive layer are formed over the semiconductor substrate 101. The materials and structures of the first insulating layer 107, the floating gate electrode 109, the second insulating layer 111, and the control gate electrode 113 which are described in Embodiment 1 can be used as materials and structures of the first insulating layer, the first conductive layer, the second insulating layer, and the second conductive layer, as appropriate.

The first insulating layer may be formed by a plasma CVD method or a low pressure CVD method, and it is preferable to form the first insulating layer by solid-phase oxidation or solid-phase nitridation by plasma treatment. This is because an insulating layer formed by oxidizing or nitriding the semiconductor substrate 101 by plasma treatment is dense, and has high withstand voltage and excellent reliability. Since the first insulating layer is used as a tunnel insulating layer for injecting charge into the subsequently formed floating gate electrode 109, such a durable first insulating layer is preferable because it can maintain an insulating property even when reduced in thickness.

For solid-phase oxidation or solid-phase nitridation by plasma treatment, it is preferable to use plasma excited by a microwave (typically 2.45 GHz) at an electron density of higher than or equal to $1 \times 10^{11}/cm^3$ and lower than or equal to $1 \times 10^{13}/cm^3$ at an electron temperature of higher than or equal to 0.5 eV and lower than or equal to 1.5 eV.

In the case of oxidation of the surface of the semiconductor substrate 101 by the plasma treatment, the plasma treatment is performed in an oxygen atmosphere (e.g., in an atmosphere containing oxygen or dinitrogen monoxide and a rare gas (containing at least one of He, Ne, Ar, Kr, and Xe), or in an atmosphere containing oxygen or dinitrogen monoxide and hydrogen and a rare gas). In the case of nitridation of the surface of the semiconductor substrate 101 by the plasma treatment, the plasma treatment is performed in a nitrogen atmosphere (e.g., in an atmosphere containing nitrogen and a rare gas (containing at least one of He, Ne, Ar, Kr, and Xe), in an atmosphere containing nitrogen, hydrogen, and a rare gas, or in an atmosphere containing ammonia and a rare gas). As a rare gas, Ar can be used, for example. Alternatively, a gas in which Ar and Kr are mixed may be used.

The first conductive layer and the second conductive layer are formed by a sputtering method, a CVD method, an evaporation method, or the like.

The second insulating layer is formed by a sputtering method, a CVD method, an evaporation method, or the like.

Figure 8A:
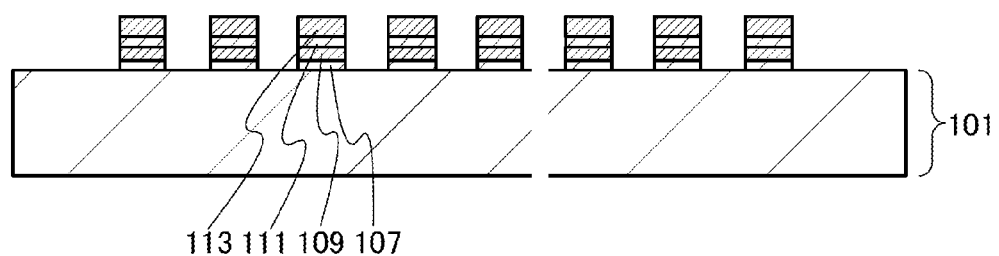
FIGS. 8A to 8C are cross-sectional views illustrating a method for manufacturing a memory device according to one embodiment of the present invention.

Next, a mask is formed over the second conductive layer through a photolithography process, and then the first insulating layer, the first conductive layer, the second insulating layer, and the second conductive layer are etched by an etching step to form the first insulating layer 107, the floating gate electrode 109, the second insulating layer 111, and the control gate electrode 113 as illustrated in FIG. 8A.

Figure 8B:
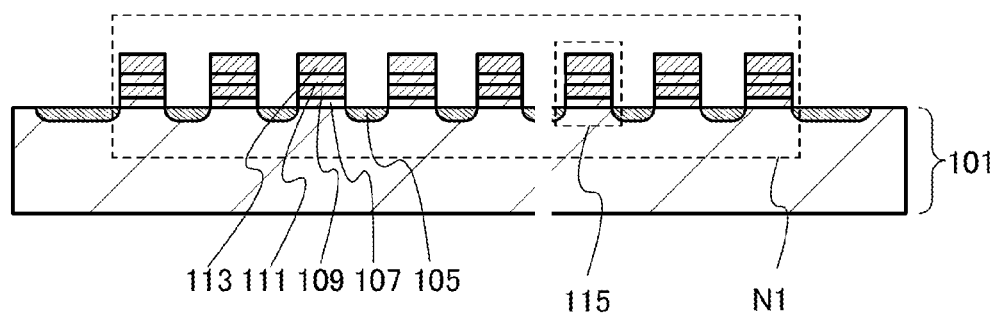

Next, an impurity is added to the semiconductor substrate 101 using the first insulating layer 107, the floating gate electrode 109, the second insulating layer 111, and the control gate electrode 113 as a mask, and then heat treatment is performed in order to activate the impurity so that the impurity region 105 is formed as illustrated in FIG. 8B. For the addition of the impurity, an ion doping method, an ion implantation method, or the like is employed as appropriate. In the case where the semiconductor substrate 101 has p-type conductivity, phosphorus or arsenic is added as the impurity. In the case where the semiconductor substrate 101 has n-type conductivity, boron is added as the impurity.

Through the above steps, the NAND cell unit N1 in which memory cells 115 are connected in series can be formed.

Figure 8C:
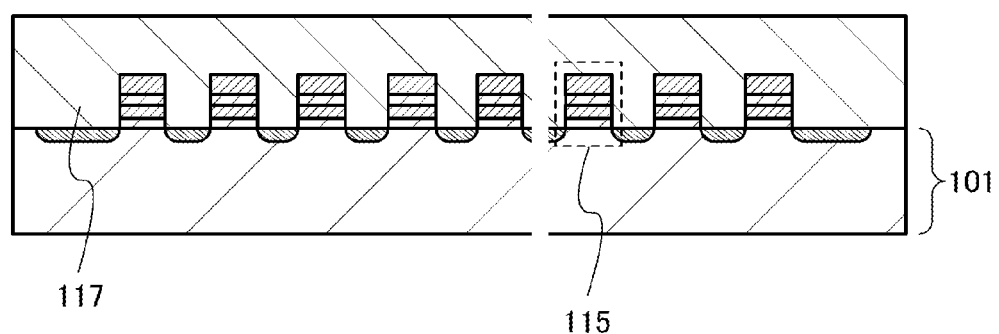

Next, as illustrated in FIG. 8C, the insulating layer 117 is formed over the semiconductor substrate 101 and the memory cells 115. The insulating layer 117 is formed in such a manner that an insulating layer is formed over the semiconductor substrate 101 and the memory cells 115 by a sputtering method, a CVD method, a coating method, a printing method, or the like, and then the insulating layer is planarized by a chemical mechanical polishing (CMP) method. With use of the insulating layer 117 that is planarized, variations in electric characteristics between the subsequently formed the selection transistors 141 and 143 can be reduced. In addition, the selection transistors 141 and 143 can be formed with high yield.

Then, a conductive layer is formed over the insulating layer 117. A mask is formed over the conductive layer through a photolithography process, and the conductive layer is etched using the mask to form the gate electrodes 121 and 123 over the insulating layer 117. The conductive layer to be the gate electrodes 121 and 123 is formed by a sputtering method, a CVD method, an evaporation method, or the like.

Figure 9A:
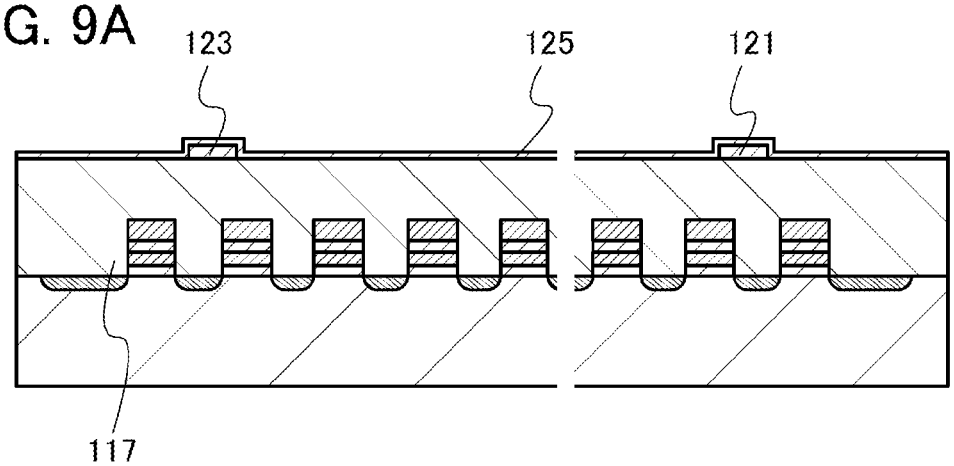
FIGS. 9A to 9C are cross-sectional views illustrating the method for manufacturing a memory device according to one embodiment of the present invention.
Figure 9B:
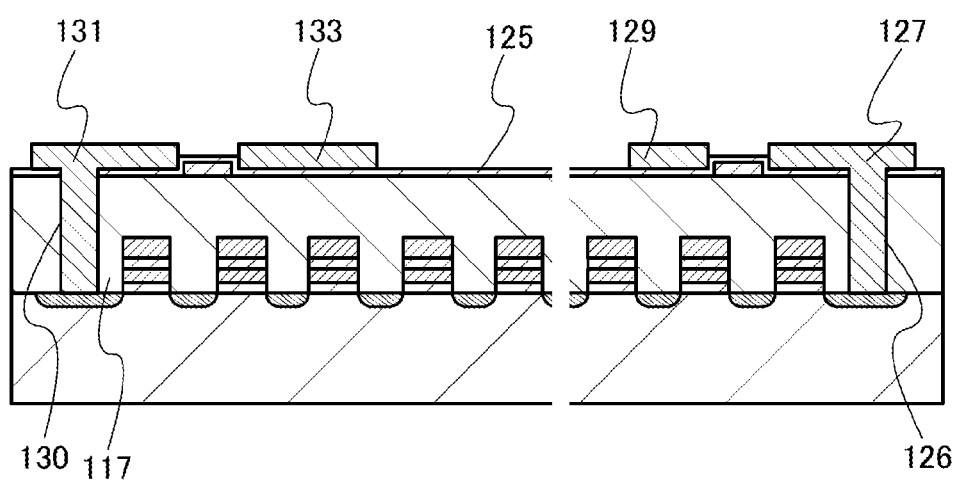

Next, the gate insulating layer 125 is formed over the insulating layer 117 and the gate electrodes 121 and 123 (see FIG. 9A). The gate insulating layer 125 is formed by a sputtering method, a CVD method, an evaporation method, or the like.

Then, a mask is formed over the gate insulating layer 125 through a photolithography process, and the insulating layer 117 and the gate insulating layer 125 are etched using the mask to form the openings 126 and 130.

Next, a conductive layer is formed over the gate insulating layer 125 and the openings 126 and 130, a mask is formed over the conductive layer through a photolithography process, and the conductive layer is etched using the mask to form the pair of electrodes 127 and 129 and the pair of electrodes 131 and 133 over the insulating layer 117 and the gate insulating layer 125. The conductive layer to be the pair of electrodes 127 and 129 and the pair of electrodes 131 and 133 is formed by a sputtering method, a CVD method, an evaporation method, or the like (see FIG. 9B).

An oxide semiconductor layer is formed over the gate insulating layer 125 and the pair of electrodes 127 and 129 and the pair of electrodes 131 and 133. The oxide semiconductor layer can be formed by a sputtering method, a coating method, a printing method, or a pulsed laser deposition method, for example.

By forming the oxide semiconductor layer while the substrate is heated to a temperature of higher than or equal to 150° C. and lower than or equal to 450° C., preferably higher than or equal to 200° C. and lower than or equal to 350° C., entry of moisture (including hydrogen) or the like into the film can be prevented. In addition, an oxide semiconductor layer including a c-axis aligned crystal material can be formed.

Before the formation of the oxide semiconductor layer, heat treatment is preferably performed to eliminate hydrogen contained in all the layers between the semiconductor substrate 101 and the pair of electrodes 127 and 129 and the pair of electrodes 131 and 133. Note that the heat treatment is preferably performed at a temperature at which oxygen is not eliminated from the gate insulating layer 125.

Next, heat treatment is performed. The temperature of the heat treatment is higher than or equal to 150° C. and lower than or equal to 650° C., preferably higher than or equal to 200° C. and lower than or equal to 500° C. In addition, heating time of the heat treatment is longer than or equal to 1 minute and shorter than or equal to 24 hours. Note that after the temperature of the heat treatment is gradually increased, the temperature may be set constant. By the heat treatment, the hydrogen concentration in the oxide semiconductor layer can be reduced. In addition, the heat treatment allows oxygen contained in the gate insulating layer 125 to be diffused into the oxide semiconductor layer; thus, oxygen defects in the oxide semiconductor layer can be reduced.

The heat treatment is preferably performed in a rare gas (typically argon) atmosphere, an oxygen atmosphere, a nitrogen atmosphere, a dry air atmosphere, a mixed atmosphere of a rare gas (typically, argon) and oxygen, or a mixed atmosphere of a rare gas and nitrogen. Specifically, a high-purity gas atmosphere is preferably used, in which the concentration of impurities such as hydrogen is reduced to approximately several parts per million (ppm) or several parts per billion (ppb).

A heat treatment apparatus used for the heat treatment is not limited to a particular apparatus, and the apparatus may be provided with a device for heating an object to be processed by heat radiation or heat conduction from a heating element such as a resistance heating element. Examples of the heat treatment apparatus include an electric furnace, or a rapid thermal annealing (RTA) apparatus such as a gas rapid thermal annealing (GRTA) apparatus or a lamp rapid thermal annealing (LRTA) apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

Next, a mask is formed over the oxide semiconductor layer through a photolithography process, and then the oxide semiconductor layer is etched using the mask to form the oxide semiconductor layers 135 and 137.

Figure 9C:
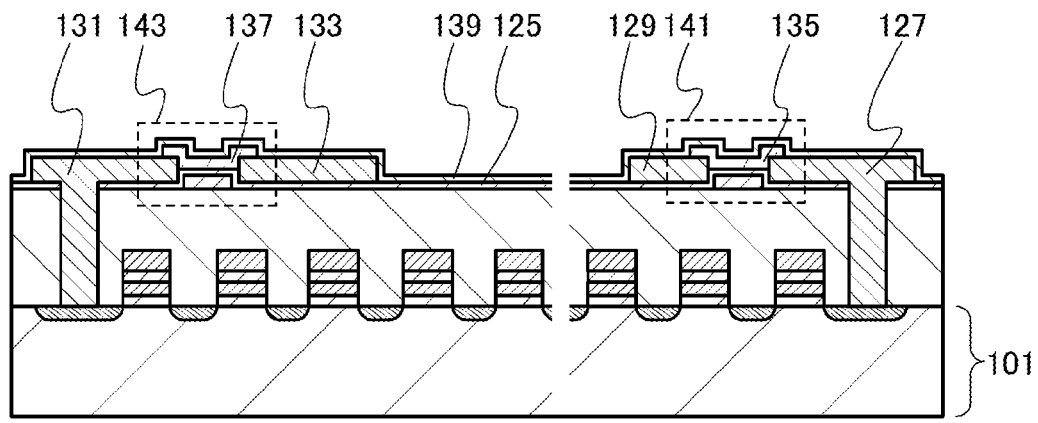
Figure 10:
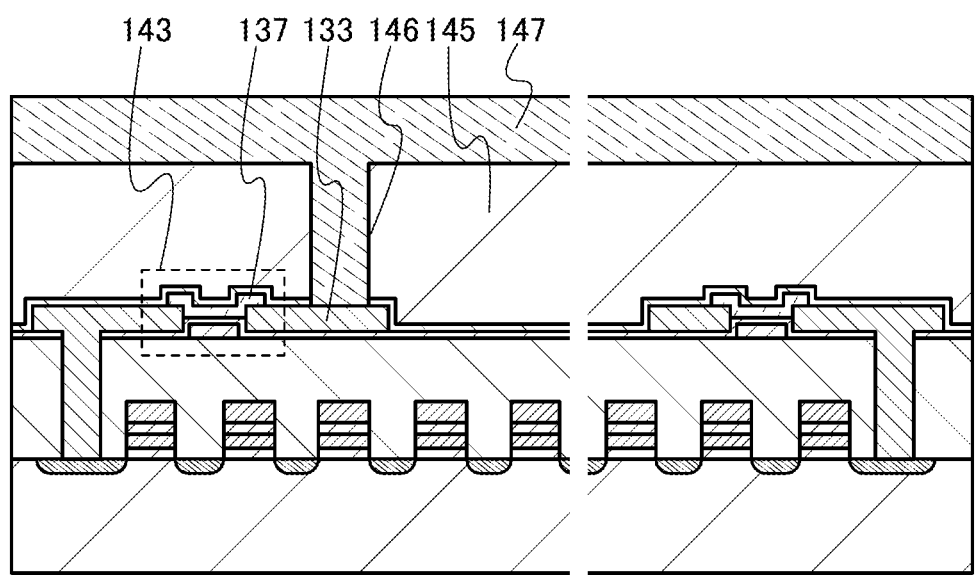
FIG. 10 is a cross-sectional view illustrating the method for manufacturing a memory device according to one embodiment of the present invention.

Next, the insulating layer 139 may be formed over the gate insulating layer 125, the pair of electrodes 127 and 129, the pair of electrodes 131 and 133, and the oxide semiconductor layers 135 and 137 (see FIG. 9C). The insulating layer 139 is formed by a sputtering method, a CVD method, an evaporation method, or the like.

After the formation of the insulating layer 139, heat treatment (temperature range: higher than or equal to 150° C. and lower than or equal to 650° C., preferably higher than or equal to 200° C. and lower than or equal to 500° C.) may be performed in an atmosphere which contains little hydrogen and moisture (such as a nitrogen atmosphere, an oxygen atmosphere, or a dry air atmosphere (in terms of moisture, for example, the dew point is lower than or equal to −40° C., preferably lower than or equal to −60° C.)).

Through the above steps, the selection transistors 141 and 143 can be manufactured.

Next, the insulating layer 145 is formed. The insulating layer 145 can be formed in a manner similar to that of the insulating layer 117.

Then, a mask is formed over the insulating layer 145 through a photolithography process, and the insulating layer 145 is etched using the mask to form the opening 146. Then, a conductive layer is formed over the insulating layer 145 and the opening 146, a mask is formed over the conductive layer through a photolithography process, and the conductive layer is etched using the mask to form the conductive layer 147 over the insulating layer 145. The conductive layer to be the conductive layer 147 is formed by a sputtering method, a CVD method, an evaporation method, or the like (see FIG. 10).

Through the above steps, the NAND cell unit and the selection transistors 141 and 143 having an extremely low off-state current can be manufactured. Therefore, a memory device in which a write error can be prevented can be manufactured. Since the selection transistors overlap with the NAND cell unit with the insulating layer interposed therebetween, a highly integrated memory device can be manufactured.

Embodiment 3

In this embodiment, a transistor which includes an oxide semiconductor layer and has a structure different from the structures in Embodiments 1 and 2 will be described.

Figure 11A:
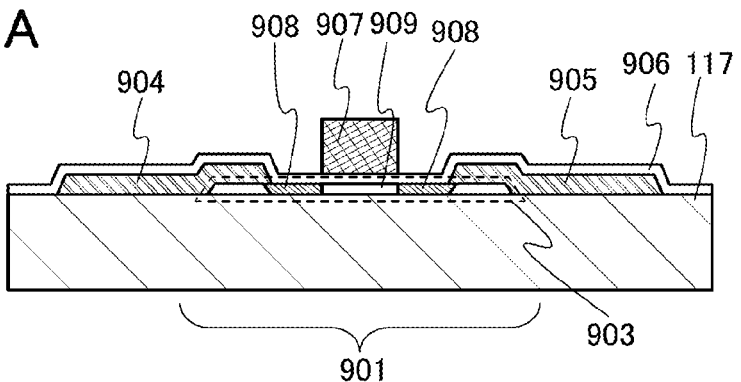
FIGS. 11A to 11D are cross-sectional views each illustrating a memory device according to one embodiment of the present invention.

A transistor 901 illustrated in FIG. 11A includes an oxide semiconductor layer 903 which is formed over the insulating layer 117 and functions as an active layer; a pair of electrodes 904 and 905 formed over the oxide semiconductor layer 903; a gate insulating layer 906 over the oxide semiconductor layer 903, and the pair of electrodes 904 and 905; and a gate electrode 907 which is provided over the gate insulating layer 906 so as to overlap with the oxide semiconductor layer 903.

The transistor 901 illustrated in FIG. 11A is of a top-gate type where the gate electrode 907 is formed over the oxide semiconductor layer 903, and is also of a top-contact type where the pair of electrodes 904 and 905 are formed over the oxide semiconductor layer 903. In the transistor 901, the pair of electrodes 904 and 905 do not overlap with the gate electrode 907. That is, the distance between the gate electrode 907 and each of the pair of electrodes 904 and 905 is larger than the thickness of the gate insulating layer 906. Therefore, in the transistor 901, the parasitic capacitance generated between the gate electrode 907 and each of the pair of electrodes 904 and 905 can be small, so that the transistor 901 can operate at high speed.

The oxide semiconductor layer 903 includes a pair of high-concentration regions 908 which are obtained by addition of dopant imparting n-type conductivity to the oxide semiconductor layer 903 after formation of the gate electrode 907. Further, the oxide semiconductor layer 903 includes a channel region 909 which overlaps with the gate electrode 907 with the gate insulating layer 906 interposed therebetween. In the oxide semiconductor layer 903, the channel region 909 is provided between the pair of high-concentration regions 908. The addition of dopant for forming the high-concentration regions 908 can be performed by an ion implantation method. As the dopant, for example, a rare gas such as helium, argon, or xenon, a Group 15 element such as nitrogen, phosphorus, arsenic, or antimony, or the like can be used.

For example, in the case where nitrogen is used as the dopant, the concentration of nitrogen atoms in the high-concentration regions 908 is preferably higher than or equal to $5 \times 10^{19}/cm^3$ and lower than or equal to $1 \times 10^{22}/cm^3$.

The high-concentration regions 908 to which the dopant imparting n-type conductivity is added have higher conductivity than the other regions in the oxide semiconductor layer 903. Therefore, by providing the high-concentration regions 908 in the oxide semiconductor layer 903, the resistance between the pair of electrodes 904 and 905 can be decreased.

In the case where an In—Ga—Zn-based oxide semiconductor is used for the oxide semiconductor layer 903, heat treatment is performed at a temperature higher than or equal to 300° C. and lower than or equal to 600° C. for one hour after nitrogen is added. Consequently, the oxide semiconductor in the high-concentration regions 908 has a wurtzite crystal structure. Since the oxide semiconductor in the high-concentration regions 908 has a wurtzite crystal structure, the conductivity of the high-concentration regions 908 can be further increased and the resistance between the pair of electrodes 904 and 905 can be decreased. Note that in order to effectively decrease the resistance between the pair of electrodes 904 and 905 by forming an oxide semiconductor having a wurtzite crystal structure, in the case of using nitrogen as the dopant, the concentration of nitrogen atoms in the high-concentration regions 908 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 903 may include a CAAC oxide semiconductor. In the case where the oxide semiconductor layer 903 includes a CAAC oxide semiconductor, the conductivity of the oxide semiconductor layer 903 can be increased as compared to the case of an amorphous semiconductor; thus, the resistance between the pair of electrodes 904 and 905 can be decreased.

By decreasing the resistance between the pair of electrodes 904 and 905, high on-state current and high-speed operation can be ensured even when the transistor 901 is miniaturized. With the miniaturization of the transistor 901, the area occupied by the memory cell can be reduced and the storage capacity per unit area in a cell array can be increased.

Figure 11B:
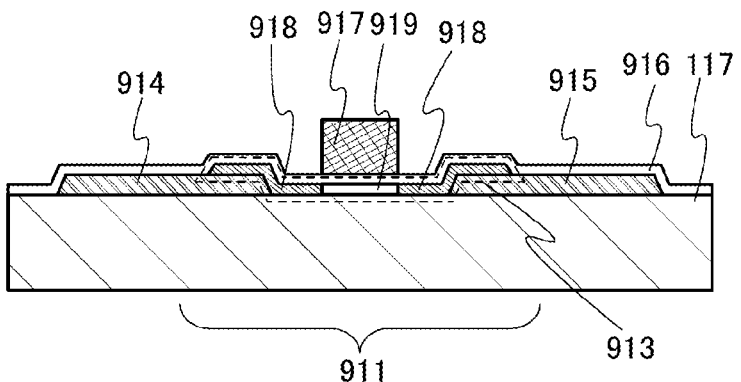

A transistor 911 illustrated in FIG. 11B includes a source electrode 914 and a drain electrode 915 formed over the insulating layer 117; an oxide semiconductor layer 913 which is formed over the source electrode 914 and the drain electrode 915 and functions as an active layer; a gate insulating layer 916 over the oxide semiconductor layer 913, and the source electrode 914 and the drain electrode 915; and a gate electrode 917 which is provided over the gate insulating layer 916 so as to overlap with the oxide semiconductor layer 913.

The transistor 911 illustrated in FIG. 11B is of a top-gate type where the gate electrode 917 is formed over the oxide semiconductor layer 913, and is also of a bottom-contact type where the source electrode 914 and the drain electrode 915 are formed below the oxide semiconductor layer 913. In the transistor 911, the source electrode 914 and the drain electrode 915 do not overlap with the gate electrode 917 as in the transistor 901; thus, the parasitic capacitance generated between the gate electrode 917 and each of the source electrode 914 and the drain electrode 915 can be small, so that the transistor 911 can operate at high speed.

The oxide semiconductor layer 913 includes a pair of high-concentration regions 918 which are obtained by addition of dopant imparting n-type conductivity to the oxide semiconductor layer 913 after formation of the gate electrode 917. Further, the oxide semiconductor layer 913 includes a channel region 919 which overlaps with the gate electrode 917 with the gate insulating layer 916 interposed therebetween. In the oxide semiconductor layer 913, the channel region 919 is provided between the pair of high-concentration regions 918.

Like the above-described high-concentration regions 908 included in the transistor 901, the high-concentration regions 918 can be formed by an ion implantation method. The kind of dopant in the case of the high-concentration regions 908 can be referred to for the kind of dopant for forming the high-concentration regions 918.

For example, in the case where nitrogen is used as the dopant, the concentration of nitrogen atoms in the high-concentration regions 918 is preferably higher than or equal to $5 \times 10^{19}/cm^3$ and lower than or equal to $1 \times 10^{22}/cm^3$.

The high-concentration regions 918 to which the dopant imparting n-type conductivity is added have higher conductivity than the other regions in the oxide semiconductor layer 913. Therefore, by providing the high-concentration regions 918 in the oxide semiconductor layer 913, the resistance between the source electrode 914 and the drain electrode 915 can be decreased.

In the case where an In—Ga—Zn-based oxide semiconductor is used for the oxide semiconductor layer 913, heat treatment is performed at a temperature higher than or equal to 300° C. and lower than or equal to 600° C. after nitrogen is added. Consequently, the oxide semiconductor in the high-concentration regions 918 has a wurtzite crystal structure. Since the oxide semiconductor in the high-concentration regions 918 has a wurtzite crystal structure, the conductivity of the high-concentration regions 918 can be further increased and the resistance between the source electrode 914 and the drain electrode 915 can be decreased. Note that in order to effectively decrease the resistance between the source electrode 914 and the drain electrode 915 by forming an oxide semiconductor having a wurtzite crystal structure, in the case of using nitrogen as the dopant, the concentration of nitrogen atoms in the high-concentration regions 918 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 913 may include a CAAC oxide semiconductor. In the case where the oxide semiconductor layer 913 includes a CAAC oxide semiconductor, the conductivity of the oxide semiconductor layer 913 can be increased as compared to the case of an amorphous semiconductor: thus, the resistance between the source electrode 914 and the drain electrode 915 can be decreased.

By decreasing the resistance between the source electrode 914 and the drain electrode 915, high on-state current and high-speed operation can be ensured even when the transistor 911 is miniaturized. With the miniaturization of the transistor 911, the area occupied by the storage element including the transistor can be reduced and the storage capacity per unit area can be increased.

Figure 11C:
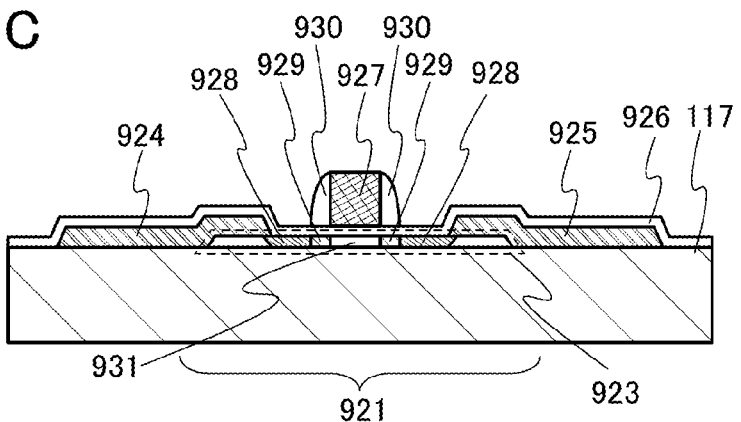

A transistor 921 illustrated in FIG. 11C includes an oxide semiconductor layer 923 which is formed over the insulating layer 117 and functions as an active layer; a pair of electrodes 924 and 923 formed over the oxide semiconductor layer 923; a gate insulating layer 926 over the oxide semiconductor layer 923, and the pair of electrodes 924 and 925; and a gate electrode 927 which is provided over the gate insulating layer 926 so as to overlap with the oxide semiconductor layer 923. In addition, the transistor 921 includes a sidewall 930 which is formed of an insulating film and is provided on a side surface of the gate electrode 927.

The transistor 921 illustrated in FIG. 11C is of a top-gate type where the gate electrode 927 is formed over the oxide semiconductor layer 923, and is also of a top-contact type where the pair of electrodes 924 and 925 are formed over the oxide semiconductor layer 923. In the transistor 921, the pair of electrodes 924 and 925 does not overlap with the gate electrode 927 as in the transistor 901; thus, the parasitic capacitance generated between the gate electrode 927 and each of the pair of electrodes 924 and 925 can be small, so that the transistor 921 can operate at high speed.

The oxide semiconductor layer 923 includes a pair of high-concentration regions 928 and a pair of low-concentration regions 929 which are obtained by addition of dopant imparting n-type conductivity to the oxide semiconductor layer 923 after formation of the gate electrode 927. Further, the oxide semiconductor layer 923 includes a channel region 931 which overlaps with the gate electrode 927 with the gate insulating layer 926 interposed therebetween. In the oxide semiconductor layer 923, the channel region 931 is provided between the pair of low-concentration regions 929 which are provided between the pair of high-concentration regions 928. The pair of low-concentration regions 929 is provided in a region which is in the oxide semiconductor layer 923 and overlaps with the sidewall 930 with the gate insulating layer 926 interposed therebetween.

Like the above-described high-concentration regions 908 included in the transistor 901, the high-concentration regions 928 and the low-concentration regions 929 can be formed by an ion implantation method. The kind of dopant in the case of the high-concentration regions 908 can be referred to for the kind of dopant for forming the high-concentration regions 928.

For example, in the case where nitrogen is used as the dopant, the concentration of nitrogen atoms in the high-concentration regions 928 is preferably higher than or equal to $5 \times 10^{19}/cm^3$ and lower than or equal to $1 \times 10^{22}/cm^3$. Further, for example, in the case where nitrogen is used as the dopant, the concentration of nitrogen atoms in the low-concentration regions 929 is preferably higher than or equal to $5 \times 10^{18}/cm^3$ and lower than $5 \times 10^{19}/cm^3$.

The high-concentration regions 928 to which the dopant imparting n-type conductivity is added have higher conductivity than the other regions in the oxide semiconductor layer 923. Therefore, by providing the high-concentration regions 928 in the oxide semiconductor layer 923, the resistance between the pair of electrodes 924 and 925 can be decreased. The low-concentration regions 929 are provided between the channel region 931 and the high-concentration regions 928, whereby a negative shift of the threshold voltage due to a short-channel effect can be reduced.

In the case where an In—Ga—Zn-based oxide semiconductor is used for the oxide semiconductor layer 923, heat treatment is performed at a temperature higher than or equal to 300° C. and lower than or equal to 600° C. after nitrogen is added. Consequently, the oxide semiconductor in the high-concentration regions 928 has a wurtzite crystal structure. Further, depending on the nitrogen concentration, the low-concentration regions 929 also have a wurtzite crystal structure due to the heat treatment. Since the oxide semiconductor in the high-concentration regions 928 has a wurtzite crystal structure, the conductivity of the high-concentration regions 928 can be further increased and the resistance between the pair of electrodes 924 and 925 can be decreased. Note that in order to effectively decrease the resistance between the pair of electrodes 924 and 925 by forming an oxide semiconductor having a wurtzite crystal structure, in the case of using nitrogen as the dopant, the concentration of nitrogen atoms in the high-concentration regions 928 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 923 may include a CAAC oxide semiconductor. In the case where the oxide semiconductor layer 923 includes a CAAC oxide semiconductor, the conductivity of the oxide semiconductor layer 923 can be increased as compared to the case of an amorphous semiconductor; thus, the resistance between the pair of electrodes 924 and 925 can be decreased.

By decreasing the resistance between the pair of electrodes 924 and 925, high on-state current and high-speed operation can be ensured even when the transistor 921 is miniaturized. With the miniaturization of the transistor 921, the area occupied by a memory cell can be reduced and the storage capacity per unit area in a cell array can be increased.

Figure 11D:
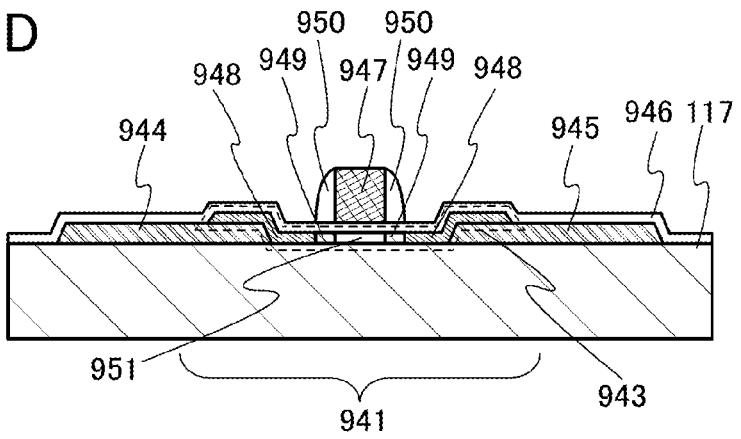

A transistor 941 illustrated in FIG. 11D includes a pair of electrodes 944 and 945 formed over the insulating layer 117; an oxide semiconductor layer 943 which is formed over the pair of electrodes 944 and 945 and functions as an active layer; a gate insulating layer 946 over the oxide semiconductor layer 943, and the pair of electrodes 944 and 945; and a gate electrode 947 which is provided over the gate insulating layer 946 so as to overlap with the oxide semiconductor layer 943. In addition, the transistor 941 includes a sidewall 950 which is formed of an insulating layer and is provided on a side surface of the gate electrode 947.

The transistor 941 illustrated in FIG. 11D is of a top-gate type where the gate electrode 947 is formed over the oxide semiconductor layer 943, and is also of a bottom-contact type where the pair of electrodes 944 and 945 are formed below the oxide semiconductor layer 943. In the transistor 941, the pair of electrodes 944 and 945 does not overlap with the gate electrode 947 as in the transistor 901. Therefore, the parasitic capacitance generated between the gate electrode 947 and each of the pair of electrodes 944 and 945 can be small, so that the transistor 941 can operate at high speed.

The oxide semiconductor layer 943 includes a pair of high-concentration regions 948 and a pair of low-concentration regions 949 which are obtained by addition of dopant imparting n-type conductivity to the oxide semiconductor layer 943 after formation of the gate electrode 947. Further, the oxide semiconductor layer 943 includes a channel region 951 which overlaps with the gate electrode 947 with the gate insulating layer 946 interposed therebetween. In the oxide semiconductor layer 943, the channel region 951 is provided between the pair of low-concentration regions 949 which are provided between the pair of high-concentration regions 948. The pair of low-concentration regions 949 is provided in a region which is in the oxide semiconductor layer 943 and overlaps with the sidewall 950 with the gate insulating layer 946 interposed therebetween.

Like the above-described high-concentration regions 908 included in the transistor 901, the high-concentration regions 948 and the low-concentration regions 949 can be formed by an ion implantation method. The kind of dopant in the case of the high-concentration regions 908 can be referred to for the kind of dopant for forming the high-concentration regions 948.

For example, in the case where nitrogen is used as the dopant, the concentration of nitrogen atoms in the high-concentration regions 948 is preferably higher than or equal to $5 \times 10^{19}/cm^3$ and lower than or equal to $1 \times 10^{22}/cm^3$. Further, for example, in the case where nitrogen is used as the dopant, the concentration of nitrogen atoms in the low-concentration regions 949 is preferably higher than or equal to $5 \times 10^{18}/cm^3$ and lower than $5 \times 10^{19}/cm^3$.

The high-concentration regions 948 to which the dopant imparting n-type conductivity is added have higher conductivity than the other regions in the oxide semiconductor layer 943. Therefore, by providing the high-concentration regions 948 in the oxide semiconductor layer 943, the resistance between the pair of electrodes 944 and 945 can be decreased. The low-concentration regions 949 are provided between the channel region 951 and the high-concentration regions 948, whereby a negative shift of the threshold voltage due to a short-channel effect can be reduced.

In the case where an In—Ga—Zn-based oxide semiconductor is used for the oxide semiconductor layer 943, heat treatment is performed at a temperature higher than or equal to 300° C. and lower than or equal to 600° C. after nitrogen is added. Consequently, the oxide semiconductor in the high-concentration regions 948 has a wurtzite crystal structure. Further, depending on the nitrogen concentration, the low-concentration regions 949 also have a wurtzite crystal structure due to the heat treatment. Since the oxide semiconductor in the high-concentration regions 948 has a wurtzite crystal structure, the conductivity of the high-concentration regions 948 can be further increased and the resistance between the pair of electrodes 944 and 945 can be decreased. Note that in order to effectively decrease the resistance between the pair of electrodes 944 and 945 by forming an oxide semiconductor having a wurtzite crystal structure, in the case of using nitrogen as the dopant, the concentration of nitrogen atoms in the high-concentration regions 948 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 943 may include a CAAC oxide semiconductor. In the case where the oxide semiconductor layer 943 includes a CAAC oxide semiconductor, the conductivity of the oxide semiconductor layer 943 can be increased as compared to the case of an amorphous semiconductor; thus, the resistance between the pair of electrodes 944 and 945 can be decreased.

By decreasing the resistance between the pair of electrodes 944 and 945, high on-state current and high-speed operation can be ensured even when the transistor 941 is miniaturized. With the miniaturization of the transistor 941, the area occupied by a memory cell can be reduced and the storage capacity per unit area in a cell array can be increased.

Note that as a method for forming high-concentration regions functioning as a source region and a drain region in a self-aligning process in a transistor including an oxide semiconductor, disclosed is a method in which a surface of an oxide semiconductor layer is exposed and argon plasma treatment is performed so that the resistivity of a region which is exposed to plasma in the oxide semiconductor layer is decreased (S. Jeon et al., "180 nm Gate Length Amorphous InGaZnO Thin Film Transistor for High Density Image Sensor Applications", *IEDM Tech. Dig.*, pp. 504-507, 2010).

However, in the above manufacturing method, after a gate insulating layer is formed, the gate insulating layer needs to be partially removed so that a portion which is to be the source region and the drain region is exposed. Therefore, at the time of removing the gate insulating layer, the oxide semiconductor layer which is below the gate insulating layer is partially over-etched; thus, the thickness of the portion which is to be the source region and the drain region becomes small. As a result, the resistance of the source region and the drain region is increased, and defects of transistor characteristics due to overetching easily occur.

In order to promote miniaturization of a transistor, a dry etching method with which high processing accuracy can be provided needs to be employed. However, the overetching easily occurs remarkably in the case where a dry etching method with which the selectivity of a gate insulating layer to an oxide semiconductor layer is not sufficiently obtained is employed.

For example, the overetching does not become a problem as long as the oxide semiconductor layer has an enough thickness; however, when the channel length is 200 nm or shorter, the thickness of the oxide semiconductor layer in a region which is to be a channel region needs to be 20 nm or shorter, preferably 10 nm or shorter so that a short-channel effect can be prevented. When such a thin oxide semiconductor layer is used, the overetching of the oxide semiconductor layer is not preferable because the resistance of the source region and the drain region is increased and defects of transistor characteristics occur as described above.

However, as in one embodiment of the present invention, addition of dopant to an oxide semiconductor layer is performed in the state where a gate insulating layer is left so as not to expose the oxide semiconductor; thus, the overetching of the oxide semiconductor layer can be prevented and excessive damage to the oxide semiconductor layer can be reduced. In addition, the interface between the oxide semiconductor layer and the gate insulating layer is kept clean. Therefore, the characteristics and reliability of the transistor can be improved.

This embodiment can be implemented in combination with any of the above embodiments.

This application is based on Japanese Patent Application serial no. 2011-004874 filed with Japan Patent Office on Jan. 13, 2011, the entire contents of which are hereby incorporated by reference.

What is claimed is:

1. A memory device comprising:
   a NAND cell unit including a plurality of memory cells connected in series;
   a first selection transistor connected to a first terminal of the NAND cell unit;
   a second selection transistor connected to a second terminal of the NAND cell unit;
   a source line connected to the first selection transistor; and
   a bit line connected to the second selection transistor,
   wherein each of the first selection transistor and the second selection transistor comprises an oxide semiconductor layer including a channel region,
   wherein the first selection transistor overlaps with the NAND cell unit with an insulating layer interposed between the first selection transistor and the NAND cell unit, and
   wherein the second selection transistor overlaps with the NAND cell unit with the insulating layer interposed between the second selection transistor and the NAND cell unit.

2. The memory device according to claim 1, wherein the oxide semiconductor layer comprises two or more elements selected from In, Ga, Sn, and Zn.

3. The memory device according to claim 1,
   wherein each of the plurality of memory cells comprises a transistor, and
   wherein a channel region of the transistor comprises a silicon.

4. The memory device according to claim 1,
   wherein each of the plurality of memory cells comprises a transistor, and
   wherein the transistor comprises a channel region formed in a semiconductor substrate.

5. A memory device comprising:
   a NAND cell unit including a plurality of memory cells connected in series;

a first selection transistor provided between a first terminal of the NAND cell unit and a source line; and
a second selection transistor provided between a second terminal of the NAND cell unit and a bit line,
wherein the first selection transistor is connected to the first terminal of the NAND cell unit and the source line,
wherein the second selection transistor is connected to the second terminal of the NAND cell unit and the bit line,
wherein each of the first selection transistor and the second selection transistor comprises an oxide semiconductor layer including a channel region,
wherein the first selection transistor overlaps with the NAND cell unit with an insulating layer interposed between the first selection transistor and the NAND cell unit, and
wherein the second selection transistor overlaps with the NAND cell unit with the insulating layer interposed between the second selection transistor and the NAND cell unit.

6. The memory device according to claim 5, wherein the oxide semiconductor layer comprises two or more elements selected from In, Ga, Sn, and Zn.

7. The memory device according to claim 5,
wherein each of the plurality of memory cells comprises a transistor, and
wherein a channel region of the transistor comprises a silicon.

8. The memory device according to claim 5,
wherein each of the plurality of memory cells comprises a transistor, and
wherein the transistor comprises a channel region formed in a semiconductor substrate.

9. A memory device comprising:
a NAND cell unit including a plurality of memory cells connected in series;
a first selection transistor; and
a second selection transistor,
wherein a first terminal of the first selection transistor is connected to a source line,
wherein a second terminal of the first selection transistor is connected to a first terminal of the NAND cell unit,
wherein a first terminal of the second selection transistor is connected to a bit line,
wherein a second terminal of the second selection transistor is connected to a second terminal of the NAND cell unit, and
wherein each of the first selection transistor and the second selection transistor comprises an oxide semiconductor layer including a channel region,
wherein the first selection transistor overlaps with the NAND cell unit with an insulating layer interposed between the first selection transistor and the NAND cell unit, and
wherein the second selection transistor overlaps with the NAND cell unit with the insulating layer interposed between the second selection transistor and the NAND cell unit.

10. The memory device according to claim 9, wherein the oxide semiconductor layer comprises two or more elements selected from In, Ga, Sn, and Zn.

11. The memory device according to claim 9,
wherein each of the plurality of memory cells comprises a transistor, and
wherein a channel region of the transistor comprises a silicon.

12. The memory device according to claim 9,
wherein each of the plurality of memory cells comprises a transistor, and
wherein the transistor comprises a channel region formed in a semiconductor substrate.

13. A memory device comprising:
a first transistor;
a second transistor;
a third transistor comprising a first floating gate electrode;
a fourth transistor comprising a second floating gate electrode;
a source line electrically connected to one of a source and a drain of the first transistor; and
a bit line electrically connected to one of a source and a drain of the second transistor,
wherein the other of the source and the drain of the first transistor is electrically connected to the other of the source and the drain of the second transistor through the third transistor and the fourth transistor,
wherein the third transistor and the fourth transistor are connected in series between the first transistor and the second transistor,
wherein each of the first transistor and the second transistor comprises an oxide semiconductor layer including a channel region, and
wherein the third transistor and the fourth transistor does not comprise an oxide semiconductor layer.

14. The memory device according to claim 13, wherein the oxide semiconductor layer comprises two or more elements selected from In, Ga, Sn, and Zn.

15. The memory device according to claim 13,
wherein each of channel regions of the third transistor and the fourth transistor comprises a silicon.

16. The memory device according to claim 13, wherein the first transistor and the second transistor are provided over the third transistor and the fourth transistor.

17. The memory device according to claim 13, wherein a region of one of a source and a drain of the third transistor and one of a source and a drain of the fourth transistor is shared with each other.

18. A memory device comprising:
a first transistor;
a second transistor;
a third transistor comprising a first floating gate electrode;
a fourth transistor comprising a second floating gate electrode;
a source line electrically connected to one of a source and a drain of the first transistor; and
a bit line electrically connected to one of a source and a drain of the second transistor,
wherein the other of the source and the drain of the first transistor is electrically connected to the other of the source and the drain of the second transistor through the third transistor and the fourth transistor,
wherein the third transistor and the fourth transistor are connected in series between the first transistor and the second transistor,
wherein each of the first transistor and the second transistor comprises an oxide semiconductor layer including a channel region, and
wherein each of the third transistor and the fourth transistor comprises a channel region formed in a semiconductor substrate.

19. The memory device according to claim 18, wherein the oxide semiconductor layer comprises two or more elements selected from In, Ga, Sn, and Zn.

20. The memory device according to claim 18, wherein each of the channel regions of the third transistor and the fourth transistor comprises a silicon.

21. The memory device according to claim 18, wherein the first transistor and the second transistor are provided over the third transistor and the fourth transistor.

22. The memory device according to claim 18, wherein a region of one of a source and a drain of the third transistor and one of a source and a drain of the fourth transistor is shared with each other.

* * * * *

UNITED STATES PATENT AND TRADEMARK OFFICE
CERTIFICATE OF CORRECTION

PATENT NO. : 8,421,071 B2  
APPLICATION NO. : 13/345834  
DATED : April 16, 2013  
INVENTOR(S) : Takehisa Hatano Page 1 of 1

It is certified that error appears in the above-identified patent and that said Letters Patent is hereby corrected as shown below:

In the Specifications

Column 6, line 35, replace "or" with --of--;

Column 7, line 34, replace "us" with --as--;

Column 11, line 14, replace "hit" with --bit--; and

Column 18, line 52, replace "923" with --925--.

Signed and Sealed this  
Sixteenth Day of July, 2013

Teresa Stanek Rea  
*Acting Director of the United States Patent and Trademark Office*